United States Patent
Wyman et al.

(10) Patent No.: US 7,705,632 B2
(45) Date of Patent: Apr. 27, 2010

(54) VARIABLE OFF-CHIP DRIVE

(76) Inventors: Theodore J. (Ted) Wyman, 37 Francestown TPK, Mont Vernon, NH (US) 03057; John Trezza, 12 White Oak Dr., Nashua, NH (US) 03063

( * ) Notice: Subject to any disclaimer, the term of this patent is extended or adjusted under 35 U.S.C. 154(b) by 51 days.

(21) Appl. No.: 11/675,287

(22) Filed: Feb. 15, 2007

(65) Prior Publication Data

US 2008/0197893 A1 Aug. 21, 2008

(51) Int. Cl.
*H03K 19/08* (2006.01)
(52) U.S. Cl. .......................... 326/82; 327/108
(58) Field of Classification Search .................. 326/82, 326/30; 327/170, 108, 109
See application file for complete search history.

(56) References Cited

U.S. PATENT DOCUMENTS

| | | | |
|---|---|---|---|
| 5,162,672 A * | 11/1992 | McMahan et al. | 326/86 |
| 5,587,119 A | 12/1996 | White | |
| 5,814,889 A | 9/1998 | Gaul | |
| 5,903,168 A | 5/1999 | Yang et al. | |
| 6,559,540 B2 | 5/2003 | Kawashima | |
| 6,706,554 B2 | 3/2004 | Ogura | |
| 6,939,789 B2 | 9/2005 | Huang et al. | |
| 2001/0033509 A1 | 10/2001 | Ahn et al. | |
| 2001/0048166 A1 | 12/2001 | Miyazaki | |
| 2002/0027441 A1 | 3/2002 | Akram et al. | |
| 2003/0047799 A1 | 3/2003 | Cheever et al. | |
| 2003/0080408 A1 | 5/2003 | Farnworth et al. | |
| 2003/0206680 A1 | 11/2003 | Bakir et al. | |
| 2004/0124523 A1 | 7/2004 | Poo et al. | |
| 2004/0262635 A1 | 12/2004 | Lee | |
| 2005/0104219 A1 | 5/2005 | Matsui | |
| 2005/0121768 A1 | 6/2005 | Edelstein et al. | |
| 2005/0127967 A1 * | 6/2005 | Allen | 327/170 |
| 2005/0146049 A1 | 7/2005 | Kripesh et al. | |
| 2006/0181312 A1 * | 8/2006 | Kobayashi et al. | 326/82 |

FOREIGN PATENT DOCUMENTS

| | | |
|---|---|---|
| EP | 0 516 866 | 12/1992 |
| EP | 0 757 386 A2 | 2/1997 |
| EP | 1 415 950 | 5/2004 |

OTHER PUBLICATIONS

International Search Report for PCT/US06/23364, dated Nov. 13, 2006.
International Search Report for PCT/US06/23297, dated Jan. 3, 2007.
International Search Report, PCT/US06/23361, dated Sep. 19, 2007.
International Search Report and Written Opinion issued in PCT/US2008/053986 mailed on Dec. 3, 2008.
International Preliminary Report on Patentability for PCT/US2008/053986 issued Aug. 19, 2009.

* cited by examiner

*Primary Examiner*—Daniel D Chang (57) ABSTRACT

A driver circuit includes a set of selectable drivers each having an individual drive capability, the drivers being selectable such that i) when a subset of the drivers is selected, a signal will be driven by the drivers at a first drive level, and ii) when the subset of the drivers and at least one additional driver is selected, signal will be driven by the drivers at a level that is greater than the first level by a level of drive provided by the least one additional driver.

27 Claims, 6 Drawing Sheets

VARIABLE OFF-CHIP DRIVE

FIELD OF THE INVENTION

The present invention relates to integrated circuits and, more particularly, to driver circuits.

BACKGROUND

Chips contain pads through which a signal can be driven off-chip to pins of another board and/or chip. The driver circuit must be designed with a predetermined output within a given tolerance range. This predetermined singular amplified drive signal must be sufficient to drive the output signal the required distance accounting for such impediments as available real estate, heat, resistance, capacitance and impedance.

In instances where chips are stacked, creating shorter runs, utilizing the full capacity of a driver would be both wasteful and inefficient since far less power is required. Stacking chips can significantly reduce the need for power consumption, and the use of a singular driver detracts from the efficiency created by stacking the chips, as each driver will be taking up very valuable real estate on the chip.

Accordingly, there is a need in the art for technology that can address one or more of the above problems.

SUMMARY OF THE INVENTION

We have derived a way to addresses the above problems, especially when utilizing a stack of hybridized chips.

One aspect involves a driver circuit that includes a set of selectable drivers each having an individual drive capability. The drivers are selectable such that i) when a subset of the drivers is selected, a signal will be driven by the drivers at a first drive level, and ii) when the subset of the drivers and at least one additional driver is selected, signal will be driven by the drivers at a level that is greater than the first level by a level of drive provided by the least one additional driver The reduced path distances of stacked hybridized chips therefore require less drive to adequately drive a signal to an off-chip board and/or chip. These conditions warrant the use of restructuring the drive portion of existing chip architecture. The approach described herein permits a designer to either tap off of cascaded drivers to drive a device using less than maximum drive when a lesser amount of drive is all that is needed.

The advantages and features described herein are a few of the many advantages and features available from representative embodiments and are presented only to assist in understanding the invention. It should be understood that they are not to be considered limitations on the invention as defined by the claims, or limitations on equivalents to the claims. For instance, some of these advantages are mutually contradictory, in that they cannot be simultaneously present in a single embodiment. Similarly, some advantages are applicable to one aspect of the invention, and inapplicable to others. Thus, this summary of features and advantages should not be considered dispositive in determining equivalence. Additional features and advantages of the invention will become apparent in the following description, from the drawings, and from the claims.

DETAILED DESCRIPTION

Typically off-chip signals are utilized to drive elements or devices by tapping off of another chip via an off-chip pad. This off-chip signal must have sufficient drive to support the various elements or devices it will be driving, or an in-line driver circuit may be necessary, which requires additional real estate. However, such a technique unnecessarily uses more power than is necessary because such a chip is typically designed to provide a signal sufficient to drive both a relatively close element or device as well as a relatively distant element or device.

Advantageously, the approach described herein can be used without radically changing current design techniques. Moreover, the techniques described herein may be utilized with pre-formed chips. As such, designers need not be hesitant to implement such a technique in their current or future designs. Should someone use routingless chip architecture or intelligence packages such as described in U.S. patent application Ser. Nos. 11/329,481, 11/329,506, 11/329,539, 11/329,540, 11/329,556, 11/329,557, 11/329,558, 11/329,574, 11/329,575, 11/329,576, 11/329,873, 11/329,874, 11/329,875, 11/329,883, 11/329,885, 11/329,886, 11/329,887, 11/329,952, 11/329,953, 11/329,955, 11/330,011 and 11/422,551, all of which are incorporated herein by reference as if fully set forth herein, this invention provides both a low-risk and low-cost migration strategy to the designer by enabling one to continue to utilize existing masks and mask technology. Ultimately, instead of implementing a singular driver in the design phase, a designer need only supplement a few cascaded drivers in its place, thus allowing the designer to take full advantage of routing and which will ultimately result in power savings. Advantageously, depending on the necessary signal strength, one need only select the corresponding tap which supplies no less than the amount necessary for the particular element or device. Additionally, utilizing this current technology, a signal can be driven more efficiently "off chip" if the connections are made by low parasitic techniques such as—through-chip via, coaxial through-chip connection, triaxial through-chip connection, back-to-front via process, chip capacitive coupling, post and penetration interconnection and tack and fuse bonding.

Figure 1:
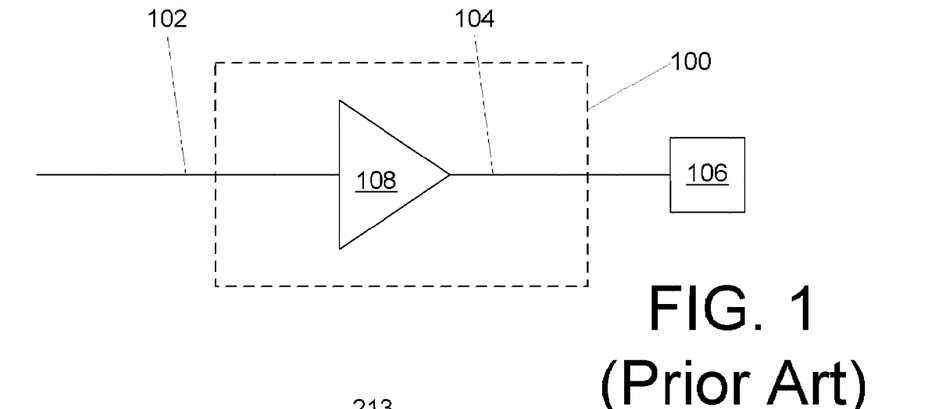
FIG. 1 illustrates, in simplified form, a schematic diagram of a portion of a chip containing a prior art driver circuit used to drive a signal "off-chip"

FIG. 1 illustrates, in simplified form, a schematic diagram of a portion (100) of a chip containing a prior art driver circuit used to drive a signal "off-chip." As shown, the drive portion (100) of the chip has an input (102) on one side and an output (104) on the other side. The input (102) side is generally connected to a signal source (not shown), and the output (104) is connected to a pad (106). The drive portion (100) is typically configured like a current amplifier to increase an input signal of "X" milliamps (mA) by a particular current gain to "Y"-mA. For use, the pad (106) will generally be connected to another element or device located on another chip and/or board via a wirebond connection and/or signal trace. While the drive portion (100) of the chip is shown as a single amplifier (108), in practice, it may be made up of multiple cascaded and parallel transistor circuits with feedback loops and/or bypasses.

Figure 2:
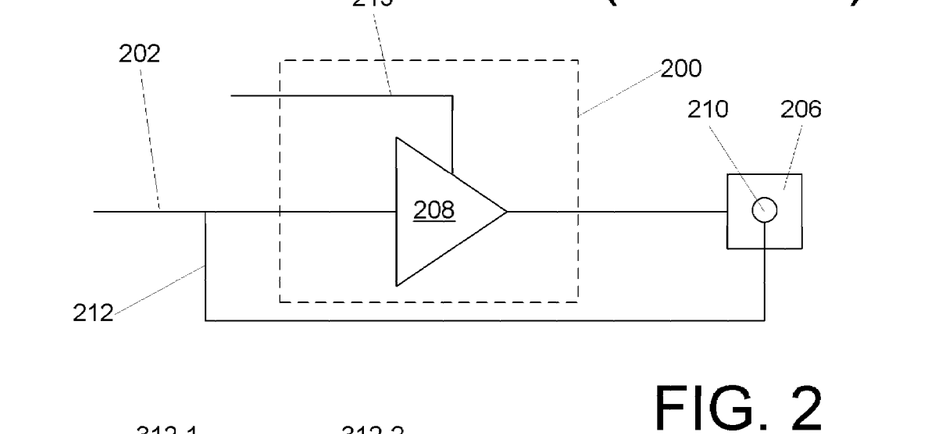
FIG. 2 illustrates, in simplified form, a simple variant incorporating the invention as a modification of the circuit of FIG. 1.

FIG. 2 illustrates, in simplified form, a simple variant incorporating the invention as a modification of the circuit of FIG. 1. As shown, a drive portion (200) of a chip is, as in FIG. 1, configured with an input (202) and an output (204) which connects to a pad (206). However, in the portion (200) of FIG. 2, the driver (208) is a tri-state driver. In addition, the pad (206) also includes a low parasitic connection (210), for example, one of the vias of the above-incorporated patent applications. A connection that bypasses the portion (200) and connects the input (202) to the low parasitic connection (210) is also included to allow for bypassing of the driver (208) when a signal will be provided on the input (202) that has sufficient drive such that use of the driver (208) is unnecessary. In such a case, it is wasteful to allow the driver to draw full power—hence the use of a tri-state driver. Advantageously, by using a tri-state driver, control logic (not shown) can be used to set the enable line (213) so as place the drive (208) into a tri state where minimal power is drawn. Thus, it can be seen that the same circuit can be used in two different ways. It can be used in a conventional manner (although the bypass line (212)) should be open circuited to avoid causing undesirable effects) or it can be used in the low power manner.

Figure 3:
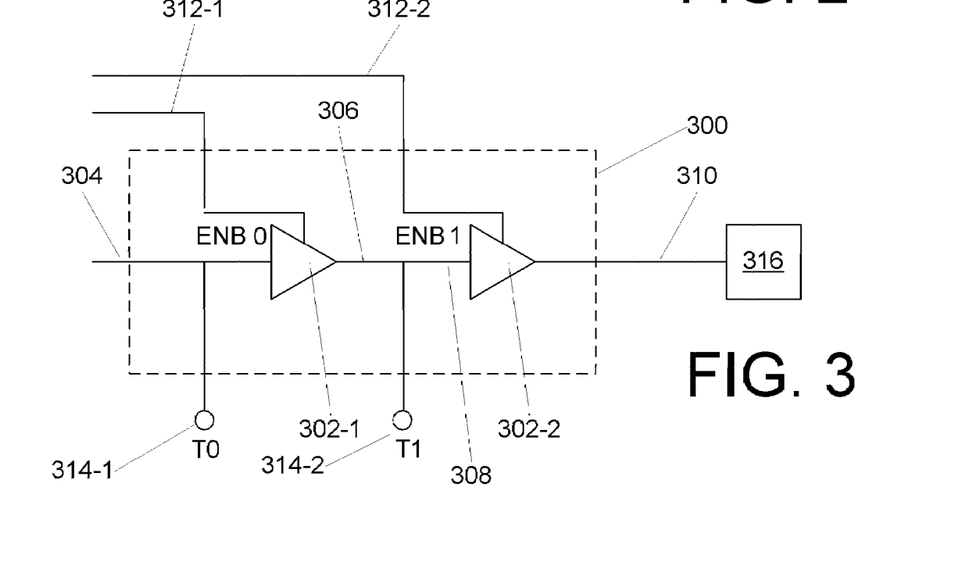
FIG. 3 illustrates, in simplified form, a schematic diagram of a portion of a chip variant of the approach.

FIG. 3 illustrates, in simplified form, a schematic diagram of a portion (300) of a chip variant of the approach, wherein the current drive portion (300) of the chip replaces the drive portion (100) of the chip of FIG. 1. As shown, two tri-state driver circuits (302-1, 302-2) replace the driver (200) of FIG. 2. In this example, the overall output will remain at Y-mA, so both drivers (302-1, 302-2) will each have some drive less than the single drive (200) of FIG. 2. The first driver (302-1) has an input (304) from a signal source on one side and an output (306) on the other side, as in FIG. 2. The current-amplified signal on the output (306) of the first driver (302-1) is supplied to the input (308) of the second driver (302-2) to be further amplified to the total output of Y-mA. Additionally, each driver circuit (302-1, 302-2) has an enabling lead (312-1, 312-2) to which an enable signal ENB0 or ENB1 can be applied which permits placing either or both driver circuits (302-1, 302-2) in an enabled, disabled or tri-state. A first tap (314-1) is provided and used when it is necessary to drive an element or device requiring less drive than is necessary to involve the first driver (302-1). In other words, it is used when the drive level of the signal source is itself sufficient for the connection and then both the first and second drivers (302-1, 302-2) will be tri-stated. A second tap (314-2) may be used when the drive of the first driver (302-1) is sufficient to drive the component or element. In other words, less drive than the second driver (302-2) would output, rather than the total drive that would be supplied by the combination of both drivers (302-1, 302-2) of Y-mA, is enough. In such a case, only the second driver (302-2) will be tri-stated. If a component or element requires the total drive of Y-mA, neither driver (302-1, 302-2) will be tri-stated so the signal can be ultimately output from the pad (316), as in the prior art, or through a low parasitic connection in the pad (316) or at some other location.

Depending upon the particular design, different drive capability arrangements can be used. For example, in one implementation variant of FIG. 3, each driver (302-1, 302-2) provides equal drive of (Y/2)-mA. In another implementation variant of FIG. 3, one driver (302-1) supplies a percentage of the total Y-mA drive, and the other driver (302-2) supplies the remaining percentage so that the combined drive still substantially equals Y-mA.

Figures 4, 7:
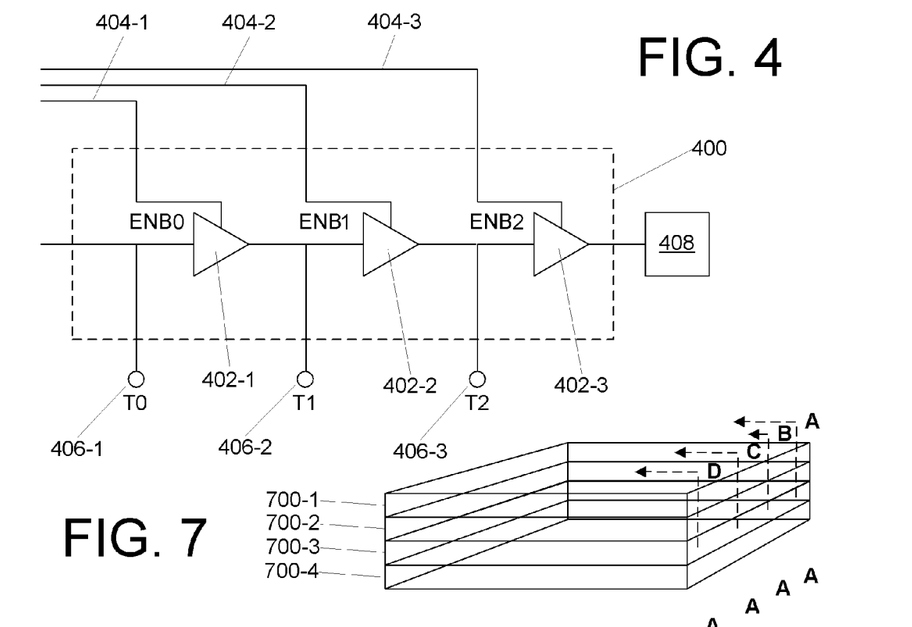
FIG. 4 illustrates, in simplified form, a schematic diagram of a portion of a chip variant of the approach similar to that of FIG. 3.
FIG. 7 illustrates in simplified form a stack of hybridized chips employing a variant of the instant approach.

FIG. 4 illustrates, in simplified form, a schematic diagram of a portion (400) of a chip variant of the approach similar to that of FIG. 3 except that a third cascaded driver circuit (402-3) is added to the driver portion (300) of FIG. 3. Specifically, three drivers (402-1, 402-2, 402-3) encompass the current drive portion (400) of the chip and, for purposes of example, have a combined overall drive of Y-mA. Each of the three drivers (402-1, 402-2, 402-3) will therefore have some drive less than the total of Y-mA. Each driver circuit (402-1, 402-2, 402-3) has a corresponding enabling lead (404-1, 404-2, 404-3) to enable placing any of the driver circuits (402-1, 402-2, 402-3) in an enabled, disabled or tri-state via signals ENB0, ENB1 and ENB2. With three drivers, one can tap-off of up to four locations (406-1, 406-2, 406-3, 408) by tri-stating the appropriate drivers (402-1, 402-2, 402-3). Specifically, the first tap (406-1) can be used when the signal itself is sufficient to drive a component or element directly. The second tap (406-2) can be used to drive a component or element when the drive supplied by only the first driver (402-1) is sufficient. The third tap (402-3) can be used to drive a component or element requiring only the drive supplied by the first two drivers (402-1, 402-2) rather than the total drive of Y-mA. Of course, if a component or element requires the total drive of Y-mA, such drive can be supplied from the pad (408), as in FIG. 3.

It should now be understood that the approach provides, as an advantage, a level of design flexibility because it enables a designer to adjust and minimize power consumption through reduced requirement runs by specifically tailoring driver outputs according to the particular element or device's requirements, specification or application. Depending upon the particular implementation, different drive capabilities can be used within a given configuration. For example, in one variant, each driver (402-1, 402-2, 402-3) provides substantially equal drive. By way of example, 33⅓%, 33⅓% and 33⅓% of the total of Y-mA of drive. Another implementation variant using this approach would provide different drive capability among the drivers (402-1, 402-2, 402-3) but the combined total drive could still equal Y-mA. By way of example, each could respectively individually provide 25%, 30% and 45% of the total drive or in the inverse, 45%, 30% and 25% of the total drive of Y-mA. In yet another variant, the proportionate contribution could be in neither ascending nor descending order. By way of example, from first input to last output, 50%, 3% and 47% of the total Y-mA of drive.

Figure 5:
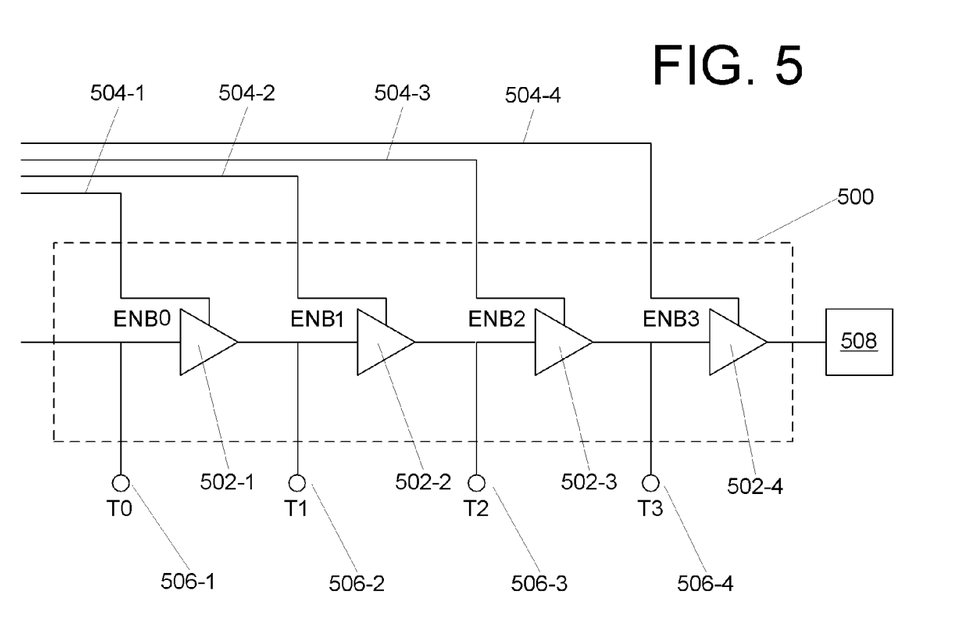
FIG. 5 illustrates, in simplified form, a schematic diagram of another variant portion of a chip using the current approach.

FIG. 5 illustrates, in simplified form, a schematic diagram of another variant portion (500) of a chip using the current approach. In this variant, a fourth cascaded driver circuit (502-4) is added to the driver circuit of FIG. 4. Specifically, the four drivers (502-1, 502-2, 502-3, 502-4) encompass the current drive portion (500) of the chip and, for purposes of explanation and consistency, have a combined overall drive of Y-mA. As with FIG. 2 through FIG. 4, each driver circuit (502-1, 502-2, 502-3, 502-4) has a corresponding enabling lead (504-1, 504-2, 504-3, 504-4) which permits a designer to independently place any of the individual drivers (502-1, 502-2, 502-3, 502-4) in an enabled, disabled or tri-state using signals ENB0, ENB1, ENB2, ENB3. Similar to FIG. 2 through FIG. 4, a designer may now utilize and tap-off at five locations (506-1, 506-2, 506-3, 506-4, 508) depending on the drive requirements for a specific element or device.

As described above with respect to FIG. 4, each driver (502-1, 502-2, 502-3, 502-4) can provide equal drive of (Y/4)-mA or some other drive configuration appropriate for the intended usage and requirements.

Figure 6:
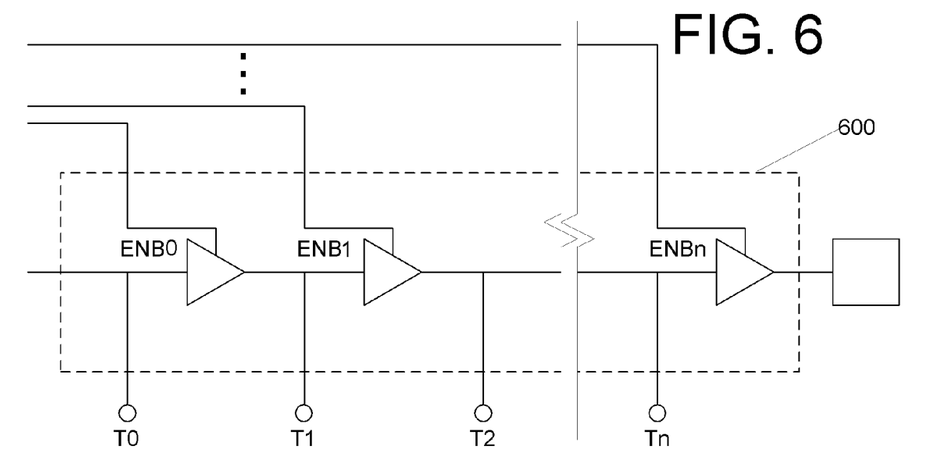
FIG. 6 illustrates, in simplified form, a variant similar to that of FIG. 5.

As will now be appreciated, the approach can be generically expanded to any number of drivers and taps. For example, FIG. 6 illustrates, in simplified form, a variant similar to that of FIG. 5 except the portion (600) has up to n drivers, n taps and n enablement leads. Again, for consistency, the total overall drive can be Y-mA, with each driver providing some portion of the overall drive.

At this point it is important to note that the number of drivers and taps need not be equal. In fact, one could have one tap per driver, multiple drivers per tap, multiple taps per driver, or even different numbers of drivers between respective taps. Thus, the continuing reference to n drivers and/or taps is intended to simply convey some number which need not be the same even as between drivers and taps of an example or from example to example.

At this point it is also useful to mention that the "taps" need not be specifically supplied as part of a design. For example, the above approach could be used with a conventional drive circuit made up of multiple stages by using a via approach, such as described in the above-incorporated U.S. patent applications, to form a low parasitic, electrically conductive connection to an intermediate point between stages where the current drive is adequate, as needed, and to disable any remaining downstream stage(s) by using a via to break one or more connections and leaving the via unfilled or filling the via with an insulator.

It is also important to recognize that there are tradeoffs and drawbacks to utilizing a large number of drivers and taps. For example, the real estate necessary for a multiplicity of drivers may reach a point where the usefulness is meaningfully overshadowed by the amount of chip real estate available or needed. Advantageously however, one can always implement multiple cascaded drivers on their own chip in a manner that allows the driver chip to be attached or hybridized to other chips and thereby facilitates use of the approach in conjunction with, for example, use of through-chip vias, coaxial through-chip connections, triaxial through-chip connections, back-to-front vias, capacitive coupling, post and penetration interconnections and/or a tack and fuse process.

FIG. 7 illustrates in simplified form a stack of hybridized chips (700-1, 700-2, 700-3, 700-4) employing a variant of the instant approach. By using a stacking approach, wirebond or other forms of off-chip connections are eliminated or reduced. As a result, interconnections among the various chips' elements or devices can be shortened. In addition, the drive, and ultimately the power consumption of the circuit can also be reduced because the capacitance, resistance and impedance on the transmission line can be minimized as well. For illustrative purposes only, this technique is only shown with four chips (700-1, 700-2, 700-3, 700-4), but it could easily be implemented with fewer or additional hybridized chips.

Figure 8:
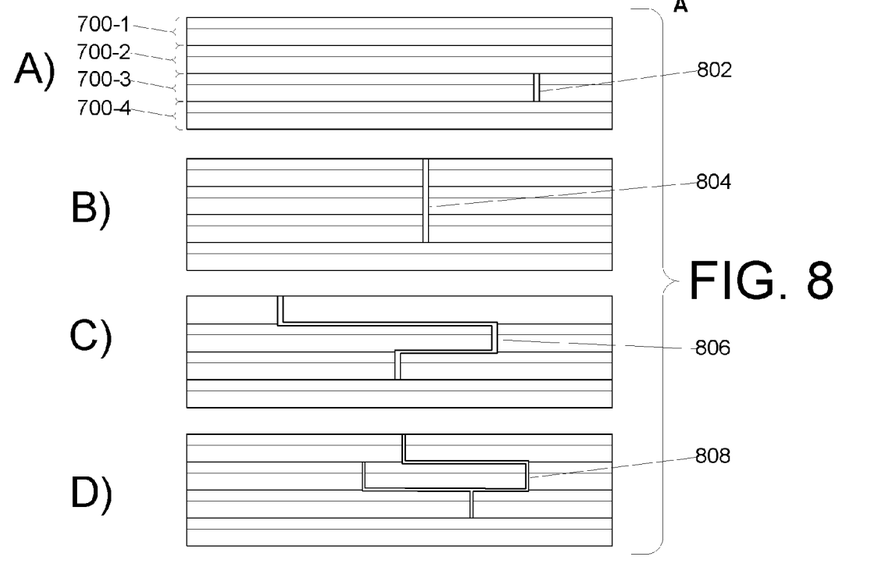
FIGS. 8A through 8D illustrate, in simplified form, different through-chip via connections involving use of a variant described herein.

FIG. 8 illustrates, in simplified form, respective cross sections of the chips of FIG. 7 taken at A-A, B-B, C-C, and D-D. To avoid clutter and confusion, only the aspects relevant to this discussion are shown, but it should be presumed that other devices, connections, vias, etc. are or may be present.

For purposes of explanatory terminology only, the chip on the bottom (700-4) will be referred to as the mother chip. The other chips (700-1, 700-2, 700-3) are referred to as daughter chips. More specifically, the daughter chips are referred to as "daughter 3" (600-1), "daughter 2" (600-2) and "daughter 1" (600-3).

FIG. 8A illustrates, in simplified form, a through-chip via connection (802) extending between the mother chip (700-4) and daughter 1 (700-3). Presuming that this connection would require minimal drive, if a driver portion 500 of FIG. 5 was used, the signal path could be taken from the first tap "T0" (506-1) to drive the element or device on daughter 1.

FIG. 8B illustrates, in simplified form, a longer through-chip via connection (804) extending directly between the mother chip (700-4) and daughter 3 (700-1) in a straight line. The increased resistance, capacitance and impedance of such a connection (804) might require additional drive than that referred to in connection with FIG. 8A. In other words, the signal drive from tap "T0" (506-1) of FIG. 5 would be inadequate. In such a case, if only a little more drive was required, the designer could tap the signal from "T1" (506-2) to drive the element or device.

FIG. 8C illustrates, in simplified form, a significantly longer connection (806) between the mother chip (700-4) and daughter 3 (700-1) involving three vias and two reroute paths, for example, to circumnavigate physical obstructions or devices of the stacked chips. However, through use of the stacked approach, the benefits of significantly shorter physical runs than would be involved in an off-chip connection of the prior art have been retained. Presuming that this longer path requires an even greater drive signal than the connection of FIG. 8B, but far less than the overall drive that would be taken off of the pad (508) of FIG. 5, the designer can choose to use the signal from tap "T2" (506-3) to drive the element or device if that would be adequate.

FIG. 8D illustrates, in simplified form, a significantly longer connection (808) between the mother chip (700-4) with a fan out to both daughter 2 (700-2) and daughter 3 (700-1). In this instance, presume that the drive from tap "T2" (506-3) would be inadequate, but the total drive from the pad (508) would be overkill. In this case, the designer could tap the signal off of tap "T3" (506-4).

Figure 9:
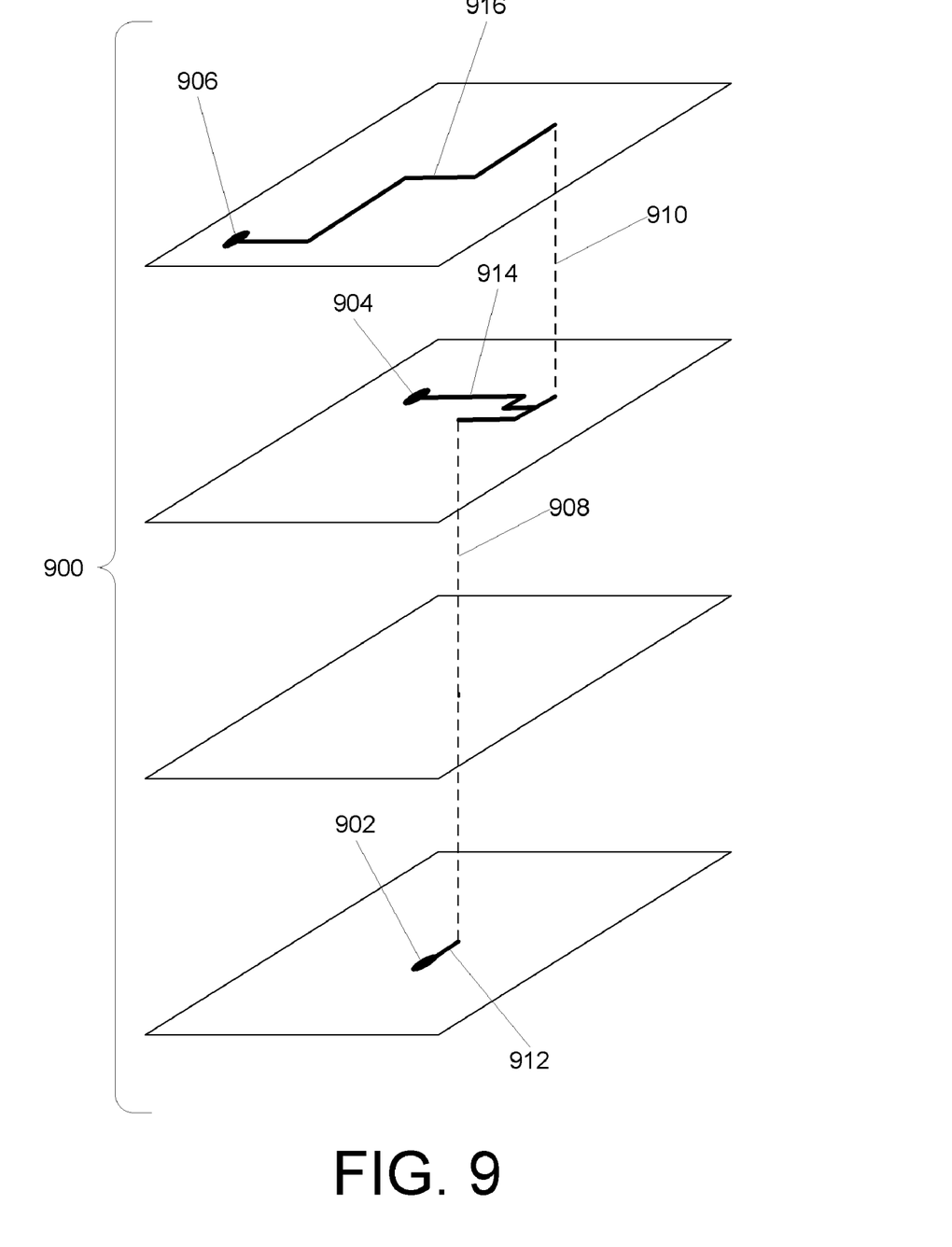
FIG. 9 illustrates, in simplified form, an alternative, exploded view of connections similar to those of FIG. 8D.

FIG. 9 illustrates, in simplified form, an alternative, exploded view (900) of connections (808) similar to those of FIG. 8D, except that they are not all lying in one plane. From this perspective, one can see a set of devices (902, 904, 906) as well as the through chip connections (908, 910) and reroute paths (912, 914, 916) interconnecting the devices (902, 904, 906). By using the above approach, a designer could assess the amount of drive needed for to adequately supply the signal to the devices (902, 904, 906) as needed while using less than the total drive a drive circuit of the prior art might supply.

Figure 10:
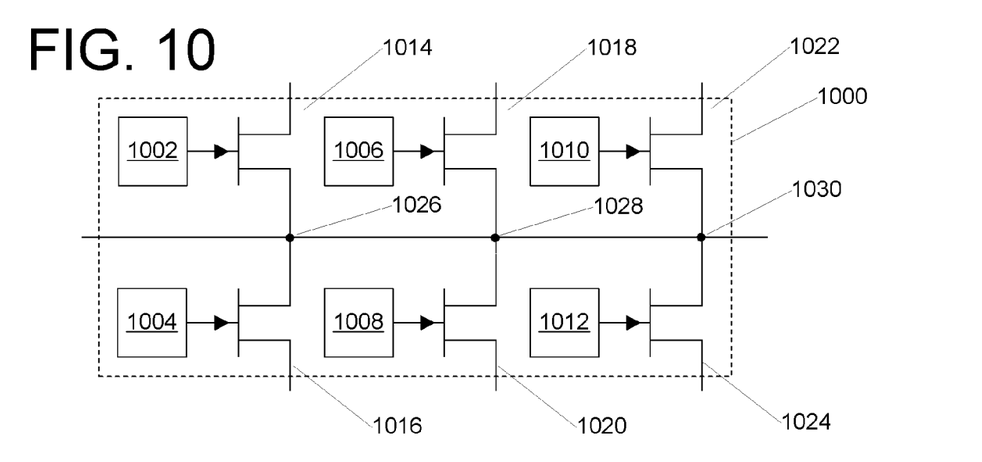
FIG. 10 illustrates, in overly simplified form, one representative example variant drive portion.

FIG. 10 illustrates, in overly simplified form, one representative example variant of drive portion circuitry (1000) that could be used to form a programmable drive output. Individual transistors are connected such that all their outputs are connected together. Programmable control logic (1002, 1004, 1006, 1008, 1010, 1012) is provided to enable or disable the individual transistors that form the drive portion circuitry (1000). The input controls are thus, the logical combination of the input signal and programmable control logic (1002, 1004, 1006, 1008, 1010, 1012).

Figure 11:
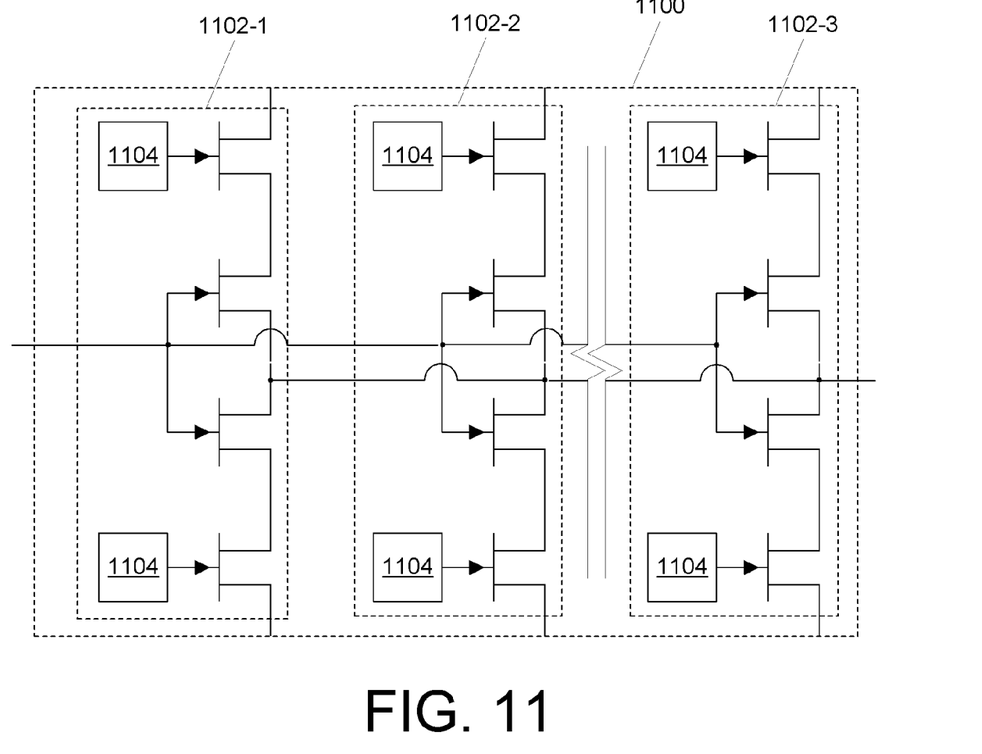
FIG. 11 illustrates, in overly simplified form, an example variant drive portion.

FIG. 11 illustrates, in overly simplified form, an example variant drive portion (1100) that is similar to that of FIG. 10, but has n stages (1102-1, 1102-2 through 1102-n) of drive capability and a simplified enabling scheme. By connecting the inputs together and, similarly, connecting the outputs together, the output drive power can be adjusted by enabling various numbers of stages. This approach can provide advantages over serial configuration approaches because 'tapping' of lines is not required.

The circuitry of FIG. 10, FIG. 11, those of the prior figures, as well as the myriad of circuit variants thereof that can be configured to operate in a similar manner, advantageously allows the output drive current to be modified to meet the requirements of a particular output load. One representative advantage of this type of circuitry approach is that it allows an integrated circuit ("IC") designer to design for various output loads on one integrated circuit. For example, a circuit could be used to drive a large output load associated with the IC on a circuit board by turning all the transistor stages on. In addition, some of the transistors could be programmed to be off to thereby reduce the power requirements when only a small load is to be driven. As a result, for example, the same IC could be used either for board applications requiring relatively high drive capability and resulting in use of most, if not all, of the available drive or a stacked IC application in which very low drive capability is needed and, thus, considerably less drive will be used.

Figure 12:
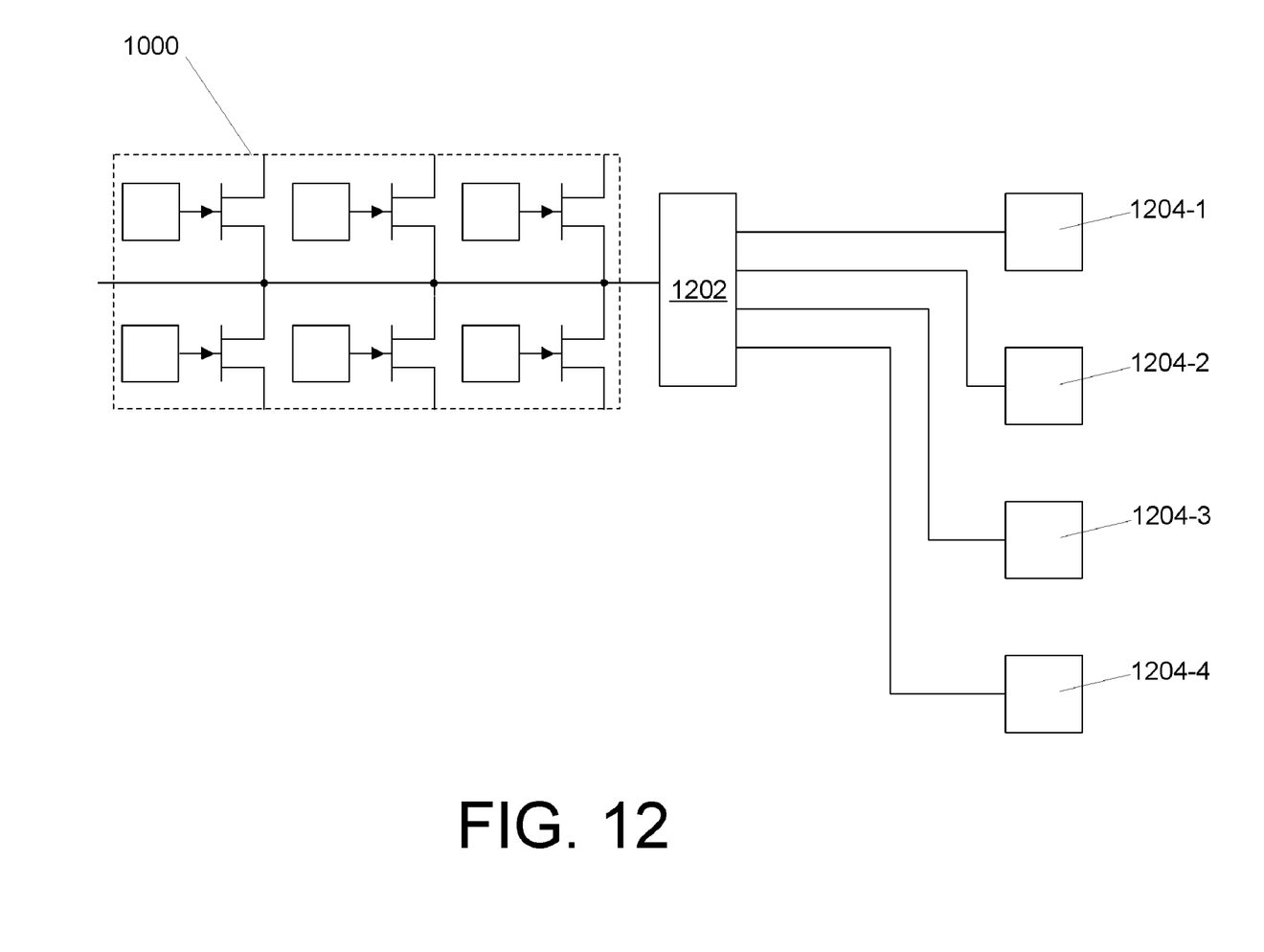
FIG. 12 illustrates, in overly simplified form, another example variant.

FIG. 12 illustrates, in overly simplified form, another example variant, illustratively using for example purposes only, the drive portion (10000) of FIG. 10. In this variant, an additional element (1202) is coupled to the output of the driver circuit (1000). In this manner, if the element (1202) is a multiplexer (MUX), a signal can be directed to any of multiple connection points (1204-1, 1204-2, 1204-3, 1204-4) as desired. Advantageously, this approach can be used off of an output as shown, or off of an individual tap. Alternatively, the element (1202) can be a demultiplexor (DEMUX) in combination with a MUX. With such an arrangement, multiple taps can be connected to the inputs to the DEMUX and the output connected to a MUX such that any tap can be connected to any of multiple connection points. Alternatively, the element could configured to operate like a crossbar switch to provide similar functionality. In this manner, additional versatility is provided that was not previously available.

Depending upon the particular implementation, in certain variants, a means can be provided in a straightforward manner to make it possible to permanently disable one or more drivers without the need to resort to use of vias or damaging the chip. One such example approach to doing so would involve incorporating one or more fusible links, for example so that, if the link is blown, a non- or minimal power drawing open or short circuit would result to disable the desired circuitry.

In addition, in certain parallel stage variants made up of multiple transistors, the transistors can be configured such that a single enable can be provided for each stage instead of an enable per transistor (although it should be appreciated that the internal circuitry of the stage may, in some implementations, result in the enable signal being applied to multiple transistors). It should, of course, be understood that the use of the term "enable" should not be construed to mean that a signal is required to specifically cause a stage or transistor to turn "on." Depending upon the particular configuration, the "enable" could actually be a "disable" such that the normal state is full drive and a signal is used to turn select transistors or stages "off."

Finally, it should be understood that the "enable" (or disable) can also be configured to be permanent for a specific through, for example, pulling the signal line "high" or "low" (e.g. to source or ground) as required, either by a circuit connection or physical opening or shorting of a connection.

It should thus be understood that this description (including the figures) is only representative of some illustrative embodiments. For the convenience of the reader, the above description has focused on a representative sample of all possible embodiments, a sample that teaches the principles of the invention. The description has not attempted to exhaustively enumerate all possible variations. That alternate embodiments may not have been presented for a specific portion of the invention, or that further undescribed alternate embodiments may be available for a portion, is not to be considered a disclaimer of those alternate embodiments. One of ordinary skill will appreciate that many of those undescribed embodiments incorporate the same principles of the invention and others are equivalent.

What is claimed is:

1. A driver circuit, comprising:
   a signal input connection;
   a plurality of individual drivers including a first individual driver and a second individual driver, wherein each of the first and second individual drivers has an input and an output, and wherein:
      the input of the first individual driver is connected to the signal input connection;
      the output of the first individual driver is connected to the input of the second individual driver; and
      the output of the second individual driver is connected to a signal output; and
   a signal tap located between the output of the first individual driver and the input of the second individual driver;
   wherein the signal input connection, the signal output, and the first and second individual drivers are located on a common semiconductor chip;
   wherein the first and second individual drivers are individually selectable so that:
      if both the first and second individual drivers are selected, a signal will be driven via the signal output by both the first and second individual drivers; and
      if only the first individual driver is selected, the signal will be driven via the signal tap; and
   wherein the signal driven via the signal output and the signal driven via the signal tap are at different levels.

2. A driver circuit, comprising:
   a signal input connection;
   a plurality of individual drivers including a first individual driver and a second individual driver wherein each of the first and second individual drivers has an input and an output, and wherein:
      the input of the first individual driver is connected to the signal input connection;
      the output of the first individual driver is connected to the input of the second individual driver; and
      the output of the second individual driver is connected to a signal output; and
   a signal tap located between the output of the first individual driver and the input of the second individual driver;
   wherein the signal input connection, the signal output, and the first and second individual drivers are located on a common semiconductor chip;
   wherein the first and second individual drivers are individually selectable so that:
      if both the first and second individual drivers are selected, a signal will be driven via the signal output by both the first and second individual drivers; and if only the first individual driver is selected, the signal will be driven via the signal tap; and wherein the plurality of individual drivers comprise n drivers, and wherein each of the plurality of individual drivers provides a drive capability of 1/n of a total drive capability of the plurality of individual drivers.

3. A driver circuit, comprising:
a signal input connection;
a plurality of individual drivers including a first individual driver and a second individual driver, wherein each of the first and second individual drivers has an input and an output, and wherein:
  the input of the first individual driver is connected to the signal input connection;
  the output of the first individual driver is connected to the input of the second individual driver; and
  the output of the second individual driver is connected to a signal output; and
a signal tap located between the output of the first individual driver and the input of the second individual driver;
wherein the signal input connection, the signal output, and the first and second individual drivers are located on a common semiconductor chip;
wherein the first and second individual drivers are individually selectable so that:
  if both the first and second individual drivers are selected, a signal will be driven via the signal output by both the first and second individual drivers; and
  if only the first individual driver is selected, the signal will be driven via the signal tap; and
wherein the plurality of individual drivers comprise n drivers, and wherein at least one of the plurality of individual drivers provides a drive capability that is different from another one of the plurality of individual drivers.

4. A driver circuit, comprising:
a signal input connection;
a plurality of individual drivers including a first individual driver and a second individual driver, wherein each of the first and second individual drivers has an input and an output, and wherein:
  the input of the first individual driver is connected to the signal input connection;
  the output of the first individual driver is connected to the input of the second individual driver; and
  the output of the second individual driver is connected to a signal output; and
a signal tap located between the output of the first individual driver and the input of the second individual driver;
wherein the signal input connection, the signal output, and the first and second individual drivers are located on a common semiconductor chip;
wherein the first and second individual drivers are individually selectable so that:
  if both the first and second individual drivers are selected, a signal will be driven via the signal output by both the first and second individual drivers; and
  if only the first individual driver is selected, the signal will be driven via the signal tap; and
wherein each individual driver has a drive capability that is greater than, or equal to, an amount of drive collectively supplied by the plurality of individual drivers.

5. The driver circuit of claim 1, further comprising a selector configured to change at least one of the plurality of individual drivers between an "off" state and an "on" state.

6. The driver circuit of claim 1, wherein at least one of the plurality of individual drivers is a tristate driver.

7. A driver circuit, comprising:
a signal input connection;
a plurality of individual drivers including a first individual driver and a second individual driver, wherein each of the first and second individual drivers has an input and an output, and wherein:
  the input of the first individual driver is connected to the signal input connection;
  the output of the first individual driver is connected to the input of the second individual driver; and
  the output of the second individual driver is connected to a signal output;
a signal tap located between the output of the first individual driver and the input of the second individual driver; and
a connection configured to permanently place one of the plurality of individual drivers in one of an "off" or an "on" state;
wherein the signal input connection, the signal output, and the first and second individual drivers are located on a common semiconductor chip: and
wherein the first and second individual drivers are individually selectable so that:
  if both the first and second individual drivers are selected, a signal will be driven via the signal output by both the first and second individual drivers; and
  if only the first individual driver is selected, the signal will be driven via the signal tap.

8. The driver circuit of claim 7, wherein the connection comprises one of a fuseable link, a short to ground, or a direct connection to a source voltage.

9. A drive circuit located on an integrated circuit chip, the drive circuit comprising:
a first driver having an input and an output, wherein the input of the first driver is connected to a source for a device signal that is to be driven off the integrated circuit chip;
a second driver having an input and an output, wherein the input of the second driver is connected to the output of the first driver;
a first signal tap between the output of the first driver and the input of the second driver, wherein through the first signal tap, the device signal can be driven off the integrated circuit chip with a drive supplied by only the first driver;
a third driver having an input and an output, wherein the input of the third driver connected to the output of the second driver; and
a second signal tap between the output of the second driver and the input of the third driver, wherein through the second signal tap, the device signal can be driven off the integrated circuit chip with a drive supplied by a combined drive of only the first and second drivers;
wherein at least one of the first driver, the second driver, or the third driver comprises a transistor.

10. The drive circuit of claim 9, further comprising a selection connection on the second driver, wherein the selection connection is configured to enable selection of whether the second driver is in an "on" state or an "off" state.

11. The drive circuit of claim 10, wherein:
the integrated circuit chip is hybridized to another integrated circuit chip;

an electrical connection exists between the first signal tap and the other integrated circuit chip; and the second driver is in an "off" state so that the device signal will be driven to the other integrated circuit by only the first driver via the first signal tap.

12. The drive circuit of claim 10, wherein:

the integrated circuit chip is hybridized to another integrated circuit chip;

an electrical connection exists between the second signal tap and the other integrated circuit chip; and the third driver is in an "off" state so that the device signal will be driven to the other integrated circuit by a combined drive provided by the first and second drivers via the second signal tap.

13. The drive circuit of claim 10, wherein:

the integrated circuit chip is hybridized to another integrated circuit chip; and an electrical connection exists between a third signal tap and the other integrated circuit chip; and the third driver is in an "on" state so that the device signal will be driven to the other integrated circuit by a combined drive provided by at least the first driver, the second driver, and the third driver via the third signal tap.

14. A driver circuit comprising a plurality of drivers, each driver having an individual drive capability, wherein the plurality of drivers are selectable so that:

if a subset of the plurality of drivers is selected, a signal will be driven by the driver circuit at a first drive level; and if the subset of the plurality of drivers and at least one additional driver are selected, the signal will be driven by the driver circuit at a second drive level, wherein the second drive level is greater than the first drive level by a level of drive provided by the at least one additional driver; and wherein a signal tap is located between two cascaded drivers of the plurality of drivers and is configured to drive a signal at a specific level.

15. The driver circuit of claim 14, further comprising a selector having an input connected to at least one driver output to enable the at least one driver output to be connected to one of at least two different connection points.

16. The driver circuit of claim 14, wherein the plurality of drivers are arranged in a set of serial stages.

17. The driver circuit of claim 16, wherein each stage comprises one or more transistors, and wherein at least one transistor in each stage is configured to be individually enabled.

18. The driver circuit of claim 14, wherein the plurality of drivers are arranged to form at least two parallel stages, wherein each stage has an input and an output, and wherein the inputs of each stage are connected to each other and the outputs of each stage are connected to each other.

19. The driver circuit of claim 18, wherein each stage comprises one or more transistors, and wherein at least one transistor in each stage is configured to be individually enabled.

20. The driver circuit of claim 18, further comprising a selection connection configured to enable selection of whether one of the plurality of drivers is in an "on" state or an "off" state.

21. The driver circuit of claim 18, wherein:

the driver circuit is located on an integrated circuit chip;

the integrated circuit chip is hybridized to another integrated circuit chip; and at least some of the plurality of drivers are individually selected to be in an "on" state so that a device signal will be driven to the other integrated circuit by a combined drive from the at least some of the plurality of drivers.

22. The driver circuit of claim 18, wherein the driver circuit is located on an integrated circuit chip, and wherein:

the integrated circuit chip is hybridized to another integrated circuit chip;

a first electrical connection exists between a signal line and the other integrated circuit chip; and at least one of the plurality of drivers is in an "off" state so that a device signal on the signal line will be driven to the other integrated circuit by at least another one of the plurality of drivers via the signal line.

23. The driver circuit of claim 22, wherein an additional one of the plurality of drivers is in an "off" state so that the device signal will be driven to the other integrated circuit by a combined drive provided by at least two of the plurality of drivers via the signal line.

24. A system, comprising:

at least a first integrated circuit chip and a second integrated circuit chip hybridized to form a stack;

a through-chip connection electrically connecting the first and second integrated circuit chips; and a driver circuit located on at least one of the first and second integrated circuit chips;

wherein the driver circuit comprises a plurality of drivers, each driver having an individual drive capability;

wherein the plurality of drivers include a pair of cascaded drivers;

wherein a tap is located between the pair of cascaded drivers; and wherein the plurality of drivers are selectable so that:

if a subset of the plurality of drivers is selected, a signal will be driven by the driver circuit at a first drive level; and if the subset of the plurality of drivers and at least one additional driver are selected, a signal will be driven by the driver circuit at a second drive level, wherein the second drive level is greater than the first drive level by a level of drive provided by the least one additional driver.

25. The system of claim 24, wherein the through-chip connection comprises:

a first end connected to the tap, wherein the pair of cascaded drivers are both located on one of the first or second integrated circuit chips; and a second end connected to a device on the other one of the first or second integrated circuit chips.

26. The system of claim 25, wherein at least one driver among the plurality of drivers has an output connected to an input from the pair of cascaded drivers.

27. The system of claim 25, wherein at least one driver among the plurality of drivers has an input connected to an output from the pair of cascaded drivers.

* * * * *